United States Patent
Watanabe

(10) Patent No.: US 6,643,830 B1
(45) Date of Patent: Nov. 4, 2003

(54) FAULT PORTION LOCATING METHOD FOR SEMICONDUCTOR INTEGRATED CIRCUIT DEVICE

(75) Inventor: Hiroshi Watanabe, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/523,699

(22) Filed: Mar. 13, 2000

(30) Foreign Application Priority Data

Mar. 26, 1999 (JP) .......................................... 11-084648

(51) Int. Cl.$^7$ .............................................. G06F 17/50
(52) U.S. Cl. .............................. 716/4; 714/738; 714/745
(58) Field of Search ........................ 716/4–6; 714/724, 714/738, 741, 745; 324/752; 382/145

(56) References Cited

U.S. PATENT DOCUMENTS

| | | | |
|---|---|---|---|
| 5,451,798 A | | 9/1995 | Tsuda et al. ................. 257/139 |
| 5,610,435 A | | 3/1997 | Watanabe et al. ........... 257/629 |
| 5,790,565 A | * | 8/1998 | Sakaguchi ................... 714/738 |
| 5,889,789 A | * | 3/1999 | Sanada ........................ 714/745 |

* cited by examiner

Primary Examiner—Vuthe Siek
Assistant Examiner—Naum Levin
(74) Attorney, Agent, or Firm—Fitzpatrick, Cella, Harper & Scinto

(57) ABSTRACT

To make it possible to locate a physically abnormal portion such as low-resistance short-circuiting between signal wirings or an open fault in a CMOS logic circuit without any design information, in a fault portion locating method for a semiconductor integrated circuit device, a first information table showing a correspondence between a physical abnormality and a defined abnormal $I_{DDQ}$ change mode is prepared in advance, a second information table showing a relationship between a model of the physical abnormality and a change of a light emitting element for the $I_{DDQ}$ abnormal pattern in an operation test pattern by emission analysis is prepared in advance, and in fault analysis, the tables are compared with the abnormal $I_{DDQ}$ obtained from the actual integrated circuit and the change of the light emitting element, respectively, to locate a physically abnormal portion.

2 Claims, 5 Drawing Sheets

TABLE 1

| ABNORMAL $I_{DDQ}$ CHANGE MODE | PHYSICAL ABNORMALITY |
|---|---|
| MODE 1 | · SIGNAL LINE OPENED<br>· POWER SOURCE LEAKAGE AT NON-LOGICAL OPERATING SECTION<br>· ANOTHER |
| MODE 2 | · SHORT-CIRCUITING BETWEEN TWO DIFFERENT SIGNAL METAL WIRINGS<br>· SHORT-CIRCUITING BETWEEN SIGNAL LINE AND VDD METAL WIRING<br>· SHORT-CIRCUITING BETWEEN SIGNAL LINE AND VSS METAL WIRING<br>· ANOTHER |
| MODE 3 | · LEAKAGE BETWEEN VDD AND VSS DUE TO CMOS ELEMENT SECTION ABNORMALITY<br>· LEAKAGE GATE AND COUNTER VDD OR VSS DUE TO ABNORMALITY OF ONE OF ELEMENTS CONSTITUTING CMOS<br>· ANOTHER |

TABLE 2

| ELEMENT CHANGE | PHYSICAL ABNORMALITY |
|---|---|
| NO | · SIGNAL LINE OPENED<br>· SHORT-CIRCUITING BETWEEN SIGNAL LINE AND METAL WIRING FOR VDD<br>· SHORT-CIRCUITING BETWEEN SIGNAL LINE AND METAL WIRING FOR VSS<br>· ANOTHER |
| CHANGE | · SHORT-CIRCUITING BETWEEN DIFFERENT SIGNALS<br>· SHORT-CIRCUITING BETWEEN GATE AND DRAIN OF EITHER Pch OR Nch OF CMOS ELEMENT<br>· SHORT-CIRCUITING BETWEEN GATE AND DRAIN OF EITHER Pch OR Nch OF CMOS ELEMENT<br>· ANOTHER |

FIG. 5

TABLE 1

| ABNORMAL $I_{DDQ}$ CHANGE MODE | PHYSICAL ABNORMALITY |
|---|---|
| MODE 1 | · SIGNAL LINE OPENED<br>· POWER SOURCE LEAKAGE AT NON-LOGICAL OPERATING SECTION<br>· ANOTHER |
| MODE 2 | · SHORT-CIRCUITING BETWEEN TWO DIFFERENT SIGNAL METAL WIRINGS<br>· SHORT-CIRCUITING BETWEEN SIGNAL LINE AND VDD METAL WIRING<br>· SHORT-CIRCUITING BETWEEN SIGNAL LINE AND VSS METAL WIRING<br>· ANOTHER |
| MODE 3 | · LEAKAGE BETWEEN VDD AND VSS DUE TO CMOS ELEMENT SECTION ABNORMALITY<br>· LEAKAGE GATE AND COUNTER VDD OR VSS DUE TO ABNORMALITY OF ONE OF ELEMENTS CONSTITUTING CMOS<br>· ANOTHER |

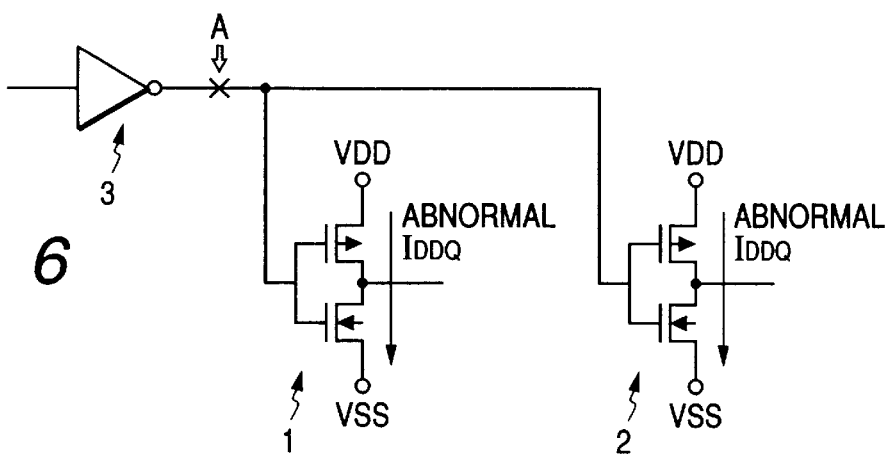

FIG. 6

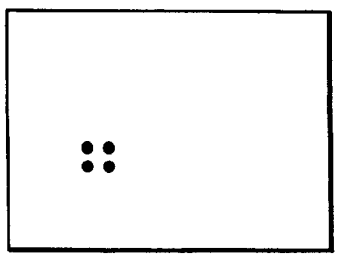

INTEGRATED CIRCUIT CHIP

FIG. 7

● : LIGHT EMITTING POINT BY EMS

FIG. 8

TABLE 2

| ELEMENT CHANGE | PHYSICAL ABNORMALITY |
|---|---|
| NO | · SIGNAL LINE OPENED<br>· SHORT-CIRCUITING BETWEEN SIGNAL LINE AND METAL WIRING FOR VDD<br>· SHORT-CIRCUITING BETWEEN SIGNAL LINE AND METAL WIRING FOR VSS<br>· ANOTHER |
| CHANGE | · SHORT-CIRCUITING BETWEEN DIFFERENT SIGNALS<br>· SHORT-CIRCUITING BETWEEN GATE AND DRAIN OF EITHER Pch OR Nch OF CMOS ELEMENT<br>· SHORT-CIRCUITING BETWEEN GATE AND DRAIN OF EITHER Pch OR Nch OF CMOS ELEMENT<br>· ANOTHER |

FIG. 9

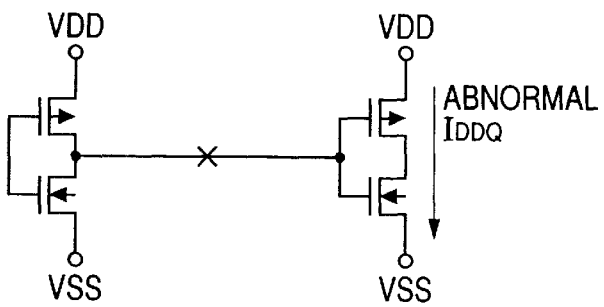

FIG. 10

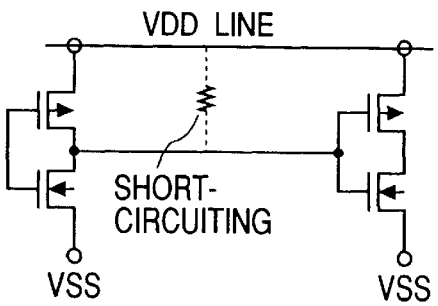

| LOGIC OF COMS ELEMENT 4 | LOGIC OF COMS ELEMENT 5 | CURRENT (ABNORMAL $I_{DDQ}$) PATH | LIGHT EMITTING ELEMENT |
|---|---|---|---|
| 0 | 0 | NO | NO |
| 0 | 1 | II | ELEMENT 5 Pch & ELEMENT 4 Nch |
| 1 | 0 | I | ELEMENT 4 Pch & ELEMENT 5 Nch |
| 1 | 1 | NO | NO |

FAULT PORTION LOCATING METHOD FOR SEMICONDUCTOR INTEGRATED CIRCUIT DEVICE

BACKGROUND OF THE INVENTION

1. Field of the Invention

The present invention relates to fault analysis of a semiconductor integrated circuit device and, more particularly, to a method of detecting and locating a fault portion in a CMOS logic integrated circuit where a power supply current (to be referred to as $I_{DDQ}$ hereinafter) flowing in an inoperative state exhibits an abnormal value.

2. Related Background Art

As a fault portion detection method of detecting a fault with an abnormal $I_{DDQ}$ in a CMOS logic circuit, the emission analysis method using an emission microscope (EMS) is used.

In this method, the operation pattern of a CMOS logic circuit is input by an LSI tester or the like, and an operation pattern in which the $I_{DDQ}$ exhibits an abnormal value is detected. The abnormal $I_{DDQ}$ pattern is input, and in this state, light emission according to the abnormal current is observed by EMS.

The light emitting portion observed by EMS is etched up to a predetermined layer, and the physical abnormality is observed with an optical microscope or electron microscope, as needed.

In addition, the internal wiring of the CMOS logic circuit is irradiated with an electron beam or brought into direct contact with a metal needle, and the operation waveform of the internal wiring is observed. A simulation is done on the basis of the design data of the CMOS logic circuit to locate the fault portion.

In the fault portion locating method using EMS, recombination light emission in the semiconductor element section is detected. When the fault mode is a low-resistance short-circuiting between metal film wirings or an open fault, light emission by EMS occurs not at the physically abnormal portion (short-circuiting between circuit wirings or open) but at the semiconductor element section connected to the abnormal portion. The element that emits light by EMS is one of signals representing a physical abnormality, though it does not always coincide with the actual fault. For this reason, an erroneous portion may be analyzed by subsequent physical analysis.

In addition, since the method using simulation always requires design information of the corresponding integrated circuit, the method can be implemented only on the maker side (designer side) of the integrated circuit.

SUMMARY OF THE INVENTION

It is an object of the present invention to locate a physical abnormality portion of a low-resistance short-circuiting between signal wirings or open fault in a CMOS logic circuit without using design information.

In the present invention, first, the operation test pattern of a semiconductor integrated circuit device such as a CMOS logic circuit is input by, e.g., an LSI tester, and an abnormal $I_{DDQ}$ pattern in all operation test patterns is detected. Changes in abnormal $I_{DDQ}$ in all operation test patterns can be classified into several modes. Taking this fact into consideration, the abnormal $I_{DDQ}$ change modes in all operation test patterns are defined.

Next, the defined abnormal $I_{DDQ}$ change modes are made to correspond to supposed physical abnormalities in advance to prepare a first information table. A change in abnormal $I_{DDQ}$ of an actual abnormality is compared with data in this table to firstly narrow the range of locating the physical abnormality.

A light emitting element by EMS in each abnormal $I_{DDQ}$ pattern is detected. A change of the light emitting element is made to correspond to a model of physical abnormality in advance to prepare a second information table. The EMS analysis result of an actual abnormality is compared with data in this table to secondly narrow the range of locating the physical abnormality. With this analysis method, the physically abnormal portion can be accurately detected and located by combining these narrowing results.

BRIEF DESCRIPTION OF THE DRAWINGS

FIG. 5 is a table (first information table) showing the relationship between the abnormal $I_{DDQ}$ change mode and a physical abnormality;

FIG. 6 is a circuit diagram showing an electrical circuit which represents the physical abnormality of the first embodiment;

FIG. 7 is a view showing an EMS light emitting portion in the first embodiment;

FIG. 8 is a table (second information table) showing the relationship between the change of the light emitting element due to EMS analysis and the physical abnormality;

FIG. 9 is a circuit diagram showing an electrical circuit that represents an open signal metal wiring as an example of physical abnormality;

FIG. 10 is a circuit diagram showing an electrical circuit that represents short-circuiting between a signal metal wiring and a VDD metal wiring as another example of physical abnormality;

DETAILED DESCRIPTION OF THE PREFERRED EMBODIMENTS

The preferred embodiments of the present invention will be described below in detail.

First Embodiment

In this embodiment, the present invention is applied to a CMOS logic integrated circuit that malfunctions due to an open signal metal line to detect and/or locate the fault portion.

Figure 1:
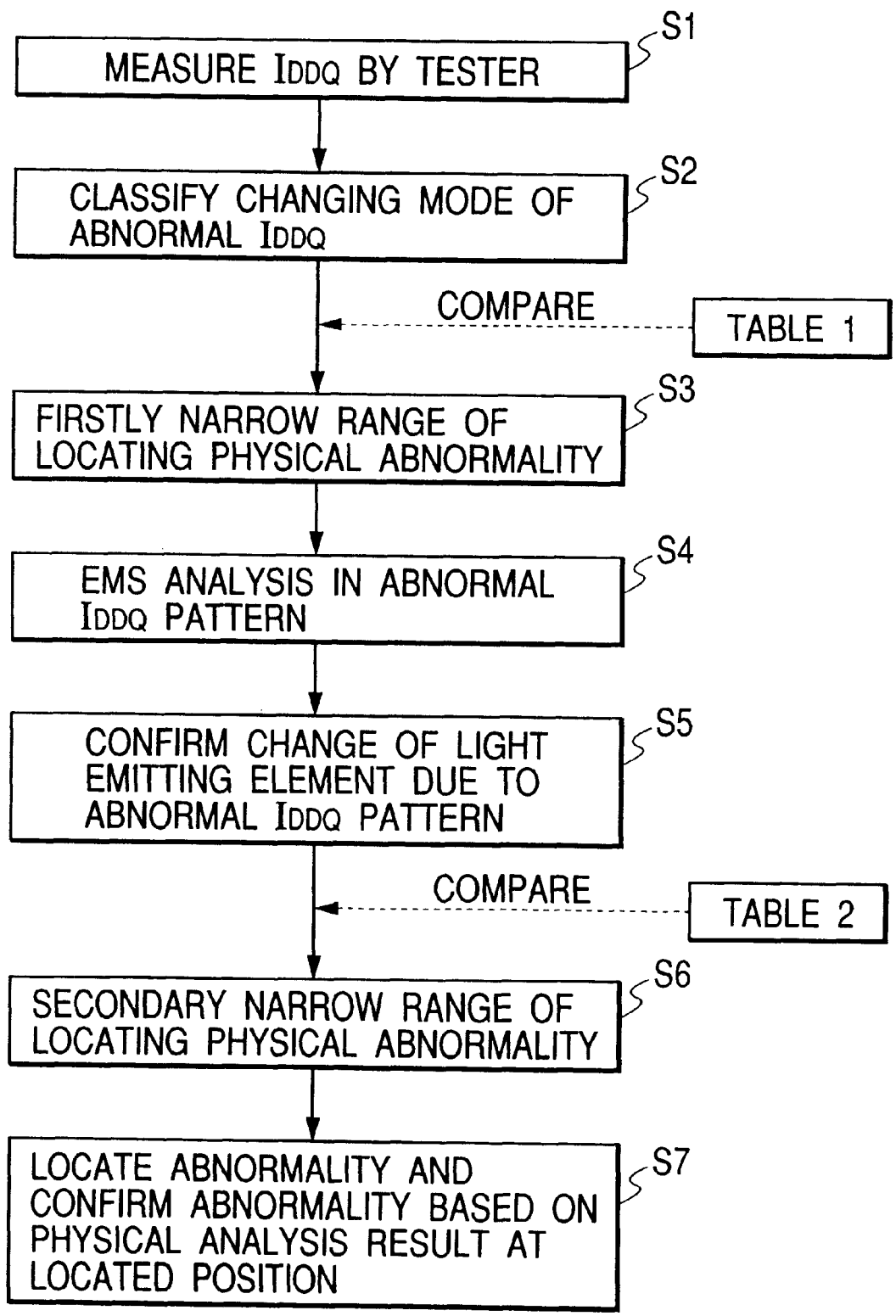
FIG. 1 is a flowchart showing physical abnormality locating according to the first embodiment of the present invention.

FIG. 1 is a flowchart showing an embodiment of a method of detecting and locating an abnormal portion in the present invention.

Figure 2:
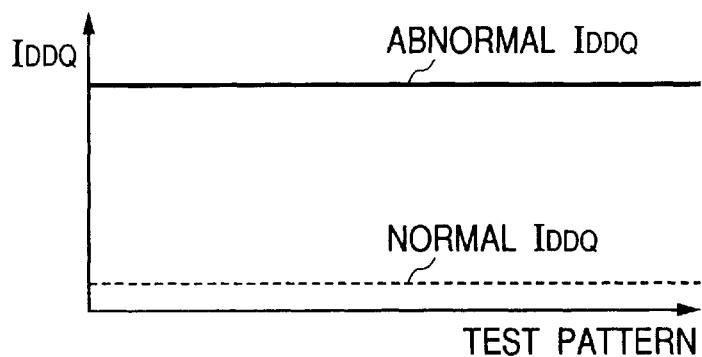
FIG. 2 is a graph showing a change in $I_{DDQ}$ in mode 1 of operation test patterns of the first embodiment.
Figure 3:
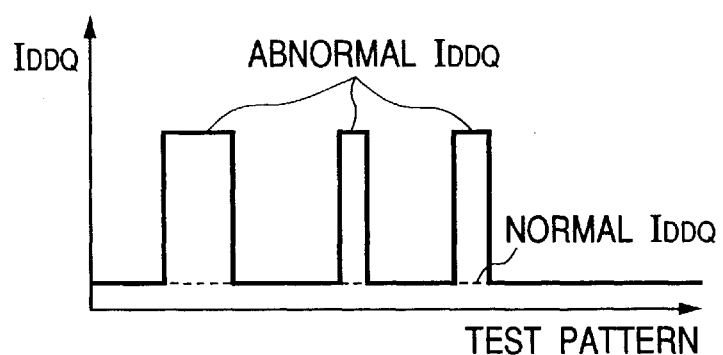
FIG. 3 is a graph showing change mode 2 of abnormal $I_{DDQ}$.
Figure 4:
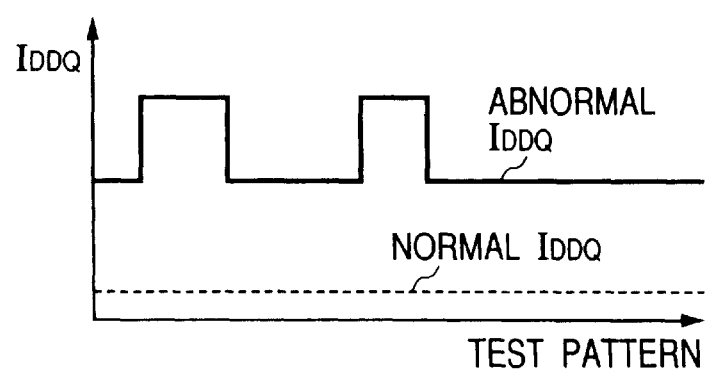
FIG. 4 is a graph showing change mode 3 of abnormal $I_{DDQ}$.

FIGS. 2 to 4 are graphs showing the relationships of changes in $I_{DDQ}$ in all operation test patterns, which are measured by inputting operation test patterns to the CMOS logic integrated circuit by an LSI tester.

FIG. 2 shows mode 1 wherein $I_{DDQ}$ always exhibits an abnormal value in all operation test patterns.

FIGS. 3 and 4 are graphs showing the relationships between the change in abnormal $I_{DDQ}$ and operation test patterns in other modes. FIG. 3 shows mode 2 wherein $I_{DDQ}$ exhibits an abnormal value or normal value depending on the operation test pattern.

FIG. 4 shows mode 3 wherein $I_{DDQ}$ always exhibits an abnormal value in all operation test patterns though the level of abnormal value changes depending on the logic state.

Changes in abnormal $I_{DDQ}$ in all operation test patterns are classified into modes and defined as described above.

The abnormal $I_{DDQ}$ is compared with a correspondence table prepared in advance, in which a change in abnormal $I_{DDQ}$ when an actual physical abnormality occurs and the above defined abnormal $I_{DDQ}$ change modes are made to correspond, thereby firstly narrowing the range of locating the physical abnormality.

FIG. 5 shows an example of the correspondence table of the abnormal $I_{DDQ}$ change modes and physical abnormalities. This is called table 1 (first information table).

FIG. 6 is a circuit diagram showing an electrical circuit which represents an open signal metal wiring as the physical abnormality of the first embodiment. FIG. 6 is a view for explaining the relationship between the physical abnormality and the abnormal $I_{DDQ}$ change mode.

Referring to FIG. 6, a set of CMOS elements 1 and 2 are connected to a common signal metal wiring. The physical abnormality is an open portion A of the signal metal wiring. An element 3 is connected to the input side of the open portion.

In this case, the CMOS elements 1 and 2 are in the floating state because the gates of the MOS transistors are open. A through current always flows between VDD and VSS independently of the logic state of the CMOS logic circuit. This causes abnormal $I_{DDQ}$ and the abnormal $I_{DDQ}$ change mode is mode 1.

A light emitting portion due to the abnormal $I_{DDQ}$ is observed using an EMS apparatus connectable to the LSI tester that has measured $I_{DDQ}$.

FIG. 7 is a view showing the image of a light emitting portion in the integrated circuit. As a characteristic feature of the first embodiment, light emission is confirmed in a plurality of element sections. Additionally, no change is observed in the elements that emit light in all operation test patterns, and light emission is confirmed in the same elements.

After confirmation of the change of the light emitting element, a table prepared in advance, which shows the correspondence between the physical abnormality and the change of the light emitting element by EMS, is compared with the change of the light emitting element to secondly narrow the range of locating the physical abnormality.

FIG. 8 is an example of the table showing the correspondence between the physical abnormality and the change of the light emitting element by EMS. This is called table 2 (second information table).

Models of physical abnormalities are represented by electrical circuits and classified into a case wherein a plurality of current paths are present depending on the combination of the logic states of CMOS elements connected to the input side of the abnormal portion and a case wherein a current always flows to a common element when an abnormal current flows independently of the logic state.

FIG. 9 shows an open (X) signal metal wiring. In this case, a through current always flows between VDD and VSS due to gate floating independently of the logic state, and the current always flows to a common element.

FIG. 10 is a circuit diagram when the physical abnormality is short-circuiting between a signal metal wiring and the VDD metal wiring. In this case, $I_{DDQ}$ flows or does not flow depending on the logic states of the elements on the input side of the short-circuiting portion. However, since only one current path is present, the element that emits light does not change.

Figures 11, 12:
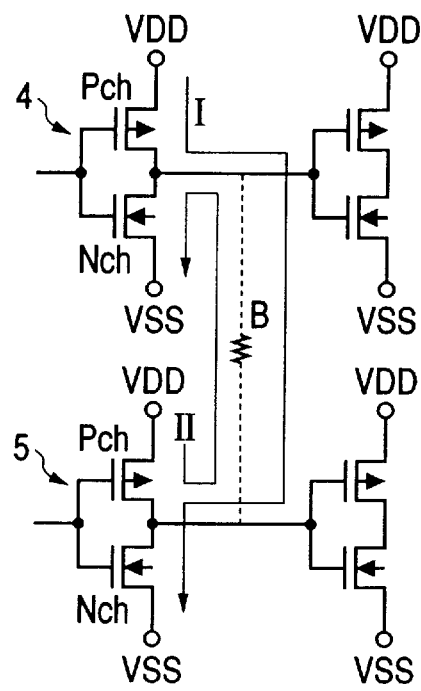
FIG. 11 is a circuit diagram showing an electrical circuit that represents short-circuiting between different signal metal wirings as still another example of physical abnormality.
FIG. 12 is a table showing the relationship between the logic state and the path of the abnormal $I_{DDQ}$ in FIG. 11.

FIG. 11 shows a case wherein short-circuiting occurs between different signal metal wirings. Referring to FIG. 11, a set of CMOS elements 4 and 5 construct the circuit. The physical abnormality is a short-circuit portion B between different signal metal wirings. Current paths I and II are determined depending on the logic states of the CMOS elements 4 and 5.

FIG. 12 is a table showing the relationship between the current paths I and II and combinations of the logic states of the two CMOS elements 4 and 5 shown in FIG. 11. Since the current path changes depending on the logic states, as shown in FIG. 12, the element that emits light also changes depending on the logic states.

A supposed physical abnormality is expressed as a model, and the change of the light emitting element by EMS is prepared in the table in advance and compared, thereby secondly narrowing the range of locating the physical abnormality.

As the models to be used herein, models up to the elements on the input and output sides of the supposed physical abnormality need be prepared. They can be prepared without using the design information of the CMOS logic integrated circuit.

In the first embodiment, when the abnormality measurement result is compared with Tables 1 and 2 shown in FIGS. 5 and 8, respectively, it can be determined that the abnormality is an open signal metal wiring.

To actually confirm the abnormal portion, observation with, e.g., an optical microscope is performed. Since the element that emits light and the physically abnormal portion are present in a region up to the element on the input side or output side including the light emitting element, observation need be performed for only this region.

In this embodiment, it is confirmed that all the elements for which light emission is confirmed are connected to the element on the input side through the common signal metal wiring. As a consequence, it is confirmed that an open portion is present at the common signal metal wiring portion.

Second Embodiment

In this embodiment, the present invention is applied to a CMOS logic integrated circuit that malfunctions due to short-circuiting between different signal metal wirings.

In the second embodiment, the change in $I_{DDQ}$ in all operation test patterns, which is measured by an LSI tester, exhibits mode 2 shown in FIG. 3.

The range of locating the physical abnormality is firstly narrowed by comparison with table 1 shown in FIG. 5.

A circuit diagram showing an electrical circuit that represents short-circuiting between the different signal metal wirings as the physical abnormality of the second embodiment is the same as in FIG. 11 described in the first embodiment. The relationship between the abnormal $I_{DDQ}$ and the logic states of two CMOS elements on the input side of the short-circuiting portion is shown in FIG. 12.

As shown in FIG. 12, $I_{DDQ}$ has a normal value or abnormal value depending on the combination of the logic states. Hence, the abnormal $I_{DDQ}$ change mode is mode 2.

Next, light emitting elements are confirmed by EMS analysis for each abnormal $I_{DDQ}$ pattern of all operation test patterns.

As the characteristic features of the second embodiment, light emission is confirmed in a plurality of light emitting elements in the abnormal $I_{DDQ}$ pattern, and that the light emitting element changes depending on the abnormal $I_{DDQ}$ pattern is confirmed.

Table 2 showing the relationship between the physical abnormality and the change of the light emitting element shown in FIG. 8 is compared with the characteristic features of the second embodiment to secondly narrow the fault mode and the range of locating the physically abnormal portion.

The physical abnormality mode in this case is shown in FIG. 11 described above. As shown in FIG. 12, since a plurality of current paths are present depending on the logic states, a model in which the light emitting element changes depending on the abnormal $I_{DDQ}$ pattern is applied.

By narrowing in two steps, it is determined that the physical abnormality of the second embodiment is short-circuiting between different signal metal wirings. Next, the actual short-circuiting portion can be located by observing the region between each light emitting element and the next element with an observation means such as an optical microscope as physical analysis.

As has been described above, the relationship between all operation test patterns and the change in abnormal $I_{DDQ}$ in a semiconductor integrated circuit device (e.g., a CMOS logic integrated circuit) is defined as the abnormal $I_{DDQ}$ change mode. A table showing the relationship between the abnormal $I_{DDQ}$ change mode and the physical abnormality is prepared in advance and compared with the physical abnormality to firstly narrow the range of locating the physical abnormality. Additionally, a table that shows the relationship between the change of the light emitting element by EMS analysis in the abnormal $I_{DDQ}$ pattern and the model of the physically abnormal portion is compared with the physical abnormality to secondly narrow the range of locating the physical abnormality. By combining the two narrowing means, the abnormal portion can be accurately located even when the physically abnormal portion is different from the light emitting element due to abnormal $I_{DDQ}$ as one of signals representing the abnormality.

Since the light emitting portion by EMS and the physically abnormal portion are present in a small region between the input-or output-side elements through a metal wiring including the light emitting element, the physical abnormality can be located without design information of the CMOS logic integrated circuit.

What is claimed is:

1. A fault portion locating method for a semiconductor integrated circuit device, comprising steps of:

preparing a first information table showing a correspondence between abnormality information and a change mode of a power supply current outputted in response to inputting an operation test pattern into the semiconductor circuit;

inputting the operation test pattern into the semiconductor integrated circuit device of which a fault portion is to be located, and detecting the change mode of the power supply current outputted therefrom;

narrowing firstly a range of locations of the fault portion, with reference to the first information table, based on the detected change mode;

preparing a second information table showing a correspondence between abnormality information and an EMS detection of a change, or lack of change, of an element of the semiconductor integrated circuit device in response to an operation test pattern;

inputting the operation test pattern into the semiconductor integrated circuit device of which a fault portion is to be located, and detecting by EMS the change, or lack of change, of the element; and narrowing a secondary range of locations of the fault portion, with reference to the second table, based on the detected change, or lack of change, of the element.

2. A method according to claim 1, wherein said semiconductor integrated circuit device is a CMOS logic circuit.

* * * * *